United States Patent [19]

Kistner

[11] Patent Number: 4,623,676
[45] Date of Patent: Nov. 18, 1986

[54] PROTECTIVE COATING FOR PHOTOTOOLS

[75] Inventor: John F. Kistner, Oakdale, Minn.

[73] Assignee: Minnesota Mining and Manufacturing Company, St. Paul, Minn.

[21] Appl. No.: 692,780

[22] Filed: Jan. 18, 1985

[51] Int. Cl.$^4$ ............... G03C 1/68; C08F 8/00; C08F 2/46; C08F 30/08

[52] U.S. Cl. .................... 522/15; 430/280; 430/288; 522/7; 522/8; 522/25; 522/170; 522/172

[58] Field of Search ......... 430/280, 914, 288; 204/157.74; 522/7, 8, 15, 25, 170, 172

[56] References Cited

U.S. PATENT DOCUMENTS

| 3,753,755 | 8/1973 | Olson | 117/3.1 |
|---|---|---|---|
| 4,025,348 | 5/1977 | Tsukada et al. | 96/115 |
| 4,025,407 | 5/1977 | Chang et al. | 204/159.14 |
| 4,077,830 | 3/1978 | Fulwiler | 156/249 |
| 4,156,035 | 5/1979 | Tsao et al. | 427/44 |
| 4,156,046 | 5/1979 | Lien et al. | 428/220 |
| 4,293,606 | 10/1981 | Zollinger et al. | 428/203 |
| 4,333,998 | 6/1982 | Leszky | 430/12 |
| 4,337,107 | 6/1982 | Eshleman | 156/249 |
| 4,348,462 | 9/1982 | Chung | 428/412 |
| 4,353,980 | 10/1982 | Helling et al. | 430/532 |
| 4,399,192 | 8/1983 | Russell | 428/412 |
| 4,426,431 | 1/1984 | Harasta et al. | 430/14 |

Primary Examiner—Richard L. Schilling
Attorney, Agent, or Firm—Donald M. Sell; James A. Smith; Lorraine R. Sherman

[57] ABSTRACT

A radiation-curable composition suitable for use as a protective coating for a photographic element comprises a polymerizable acrylic compound, a polymerizable epoxy-functional silane compound, a free-radical photoinitiator capable of initiating polymerization of said acrylic compound, and 0 to 2 percent of the total composition on a weight basis of a cationic photoinitiator capable of initiating polymerization of said epoxy-functional silane compound, said composition containing epoxy functionality only in a silane compound.

13 Claims, No Drawings

PROTECTIVE COATING FOR PHOTOTOOLS

FIELD OF THE INVENTION

This invention relates to a radiation-curable composition which provides a protective coating on a photographic element such as a phototool. In another aspect, the present invention relates to a photographic element bearing a protective coating. In a further aspect, it relates to a method for preparation of the coated element.

BACKGROUND OF THE INVENTION

In the printed circuit industry, photographic masks or stencils bearing a circuit pattern, are known as phototools. Such a stencil, which commonly is a diazo film or a gelatino/silver halide emulsion on a polyester base through which a photoresist can be exposed, provides an intricate, complex image representing an electrical circuit. The image often consists of many fine lines and junctions spaced closely together. During its use to make printed circuit boards, the phototool is placed face down on a photoresist layer and a contact print is made by exposing the photoresist to high intensity light through the phototool. In this way, a single phototool can be used to make hundreds of contact prints.

After processing, a phototool must be carefully inspected through a microscope to insure that there are no breaks in the fine lines of the image. The continued use of the phototool causes tiny scratches and abrasions on the phototool surface. The photoresists on which the phototool is placed, are usually laminated on sheet copper; small burrs or rough edges of the copper sheet can cause scratches as the phototool is transferred from one photoresist to the next. The phototool is frequently wiped with a soft cloth to make sure it is dust and lint free because small particles of dirt can cause scratching as they are wiped across the phototool surface. Because of this general wear and tear on the phototool surface during normal use, the phototool must be frequently reinspected (after 20 to 50 exposures) to insure line continuity. Depending on the size and the intricacy of the phototool, such microscopic inspections can take up to 2 to 3 hours.

The fact that phototools are vulnerable to scratching and that abrasion is a serious problem during the normal use of a phototool is confirmed by the large number of patents claiming diazo-type emulsions having toughness and resistance to abrasion that are said to be useful in circuit board technology.

Protective overcoats for photographic elements are well known, and a wide variety of products have been proposed in the patent literature. Polyester films, coated with various kinds of pressure sensitive adhesives, have been laminated to image-bearing surfaces to protect the image. For example, U.S. Pat. No. 4,337,107 discloses laminating a film of cured epoxy-silane to produce a protective film exhibiting superior abrasion resistant properties. Because of their thickness (total of polyester base and adhesive layer), the laminating films cause optical distortion and hence loss of resolution. In addition, air is often entrapped in the soft pressure-sensitive adhesive during the laminating process, causing the finished product to contain undesirable air bubbles. Thinner protective coatings can be obtained, and with the exclusion of air pockets, by coating the surfaces of photographic elements with liquid compositions. After application, the thin liquid coating is hardened to yield the desired protective coat. Epoxy-silanes are especially useful in such coatings because of their resistance to abrasion; epoxy-silanes have the additional benefit of adhering well to silver halide emulsions and to other substrates. Examples of photographic coatings based on epoxy-silane compounds may be found in U.S. Pat. Nos. 4,156,046, 4,293,606 and 4,337,107.

Acrylate esters, and in particular the polyurethane acrylates, also offer good resistance to abrasion. Compositions based on acrylates cure rapidly and produce coatings of excellent clarity. Photographic applications of acrylics for protective overcoats are described in U.S. Pat. Nos. 4,333,998, 4,353,980, and 4,399,192.

In all cases, overcoats on photographic products must meet exacting requirements with respect to transparency, flexibility, adhesion, and thickness. But, in the case of phototools, even stricter requirements must be met. For example, the commercial product based on U.S. Pat. No. 4,077,830 provides a laminating film which produces an overcoat ranging in thickness from 25 to 51 micrometers (1 to 2 mils); such thicknesses limit optical resolutions to about 1 lp/457 micrometers (1 lp/18 mil) [this corresponds to a set of two parallel lines and a space between them, each line and space having the same width, fitting into a width of 18 mils]. This severely limits the application because phototools often require resolutions greater than one line pair/457 micrometers. In addition, the thickness of the overlay causes parallax during contact printing and this results in poor wall quality in the final printed circuit. While the above mentioned epoxy-silanes adhere well to silver halide emulsions, compositions described in the patents readily attack diazo emulsions. When the liquid compositions are applied to the imaged surface of a diazo phototool, the liquids aggressively attach the diazo emulsion and dissolve the image. The compositions are too efficient a solvent to be coated on a diazo phototool. While the acrylate compositions of the above patents are not nearly as aggressive towards the diazo emulsions as are the epoxy-silanes, they suffer from the disadvantage of not adhering to silver halide emulsions and to many other substrates. Since some phototools use silver halide emulsions, the acrylates, per se, would be unsuitable as a protective overcoat. While the above mentioned systems are useful for their specified applications, they fall short of the damanding requirements for use on phototools. The tapes are too thick and cause optical distortions, and their soft adhesives entrap air during lamination. The epoxy-silanes aggressively attack the diazo emulsions and dissolve the images they are suppose to protect. The acrylates exhibit poor adhesion to silver halide type emulsions.

Coating compositions which contain both a component whose polymerization is initiated by a free-radical catalyst and a component whose polymerization is cationically initiated, and wherein both components polymerize simultaneously via separate mechanisms, are known as a "mixed" or "hybrid" system. For example, acrylic systems that copolymerize with epoxy systems using two different photoinitiating catalysts are described in U.S. Pat. Nos. 4,025,348 and 4,156,035. U.S. Pat. No. 3,753,755 describes a mixed system of acrylic and epoxy compounds which is polymerized by heat alone, while U.S. Pat. No. 4,025,407 describes an acrylic and epoxy system which is cured by a combination of heat and light. U.S. Pat. No. 4,348,462 claims a mixed system of acrylics and silanes. U.S. Pat. No. 4,426,431 reports a mixed system of acrylics, epoxies, and silanes which are photopolymerized by two different photoinitiators and said to be useful as a restorative and protective treatment for photographic elements.

SUMMARY OF THE INVENTION

Briefly, the present invention provides a radiation-curable coating composition useful for providing protective overcoats, for example, on both diazo and silver halide type phototools. The composition is comprised of (1) an acrylic compound (a free-radical polymerizable component) and a free-radical photoinitiator, (2) an epoxy-functional, i.e., oxirane-functional, silane compound (a cationically polymerizable component) and, optionally, a cationic photoinitiator, both of which polymerizations are simultaneously triggered by a single light source. The composition contains epoxy functionality only in a silane compound. The protective coating provides solvent repellency and protection against abrasion.

The free-radical polymerizable component is an acrylic compound and is present in the largest quantity in the coating composition. It is advantageous to the composition because of its ability to polymerize rapidly, and because of its mild behavior towards easily dissolved diazo emulsions. The cationically polymerizable component, which is an epoxy-silane compound, promotes adhesion to silver halide emulsions and increases abrasion resistance. A free-radical photoinitiator is needed in order to polymerize the acrylic compound. A cationic photoinitiator may be required to initiate polymerization of the epoxy-silane compound when the amount of epoxy-silane exceeds 1 percent of the total composition on a weight basis.

The present invention provides two distinctly different polymerization mechanisms (free-radical and cationic) and is therefore a "mixed system".

Mixed systems are difficult to formulate because of the potential for one component to interact or interfere with the other. There is a high probability that one component of a mixed system will polymerize faster than the other component, and thereby "force out" or "kick out" the slower polymerizing component as polymerization takes place. Even if both components of a mixed system can be made to polymerize at roughly the same relative rates, long-term shelf stability of the coating liquid is often difficult to achieve due to incompatibility of the various ingredients and a tendency for phase separation.

It has been surprising to find, in accordance with this invention, that phase separations do not occur, and good shelf-stability results when a mixed system of acrylic compounds and an epoxy-silane compound is catalyzed with, for example, a benzil ketal as the free-radical photoinitiator, and, for example, an aromatic sulfonium salt as the cationic photoinitiator. Excellent solubility and compatibility of all ingredients occurs and the resulting cured coatings adhere well to both silver halide and diazo emulsions. In addition, the cured coatings provide the necessary flexibility, transparency, and abrasion resistance required for a protective coating on phototools.

The present invention also provides a method for applying onto a phototool and curing the coating composition of the present invention under carefully controlled conditions to produce an effective protective coating.

DETAILED DESCRIPTION

The radiation-curable coating composition of the present invention which is especially useful for providing a protective overcoat on photographic elements, for example on phototools of both the diazo and silver halide type, is comprised of:
  (a) at least one polymerizable acrylic compound,
  (b) a polymerizable epoxy-functional silane compound,
  (c) at least one free-radical photoinitiator capable of initiating polymerization of the acrylic compound, and
  (d) optionally, a cationic photoinitiator capable of initiating polymerization of the epoxy-functional silane compound.

The proportions of each of the components of the radiation-curable composition of this invention can be varied widely, as desired.

The first essential ingredient in the radiation-curable compositions employed in the practice of this invention is at least one polymerizable acrylic compound. Acrylic compounds which are non-silane- and non-epoxy-containing include difunctional acrylate monomers and monomers having more than two acrylate functional groups, and mixtures thereof, to provide toughness and a rapid rate of cure. Preferably, the composition contains a mixture of di- and polyfunctional acrylate monomers. Examples of difunctional acrylic monomers that are useful in the compositions of this invention include acrylic and methacrylic diesters such as triethylene glycol dimethacrylate, ethylene glycol dimethacrylate, tetraethylene glycol dimethacrylate, polyethylene glycol 200 dimethacrylate, 1,3-butylene glycol diacrylate, 1,4-butanediol diacrylate, diethylene glycol diacrylate, diethylene glycol dimethacrylate, 1,6-hexanediol diacrylate, 2,2-dimethylpropane-1,3-diacrylate, tetreathylene glycol diacrylate, tripropylene glycol diacrylate, and ethoxylated bisphenol-A diacrylate. Examples of useful acrylic compounds having functionalities greater than two include acrylic and methacrylic polyesters such as trimethylolpropane trimethacrylate, trimethylolpropane triacrylate, pentaerythritol tetramethacrylate, pentaerythritol tetraacrylate, dipentaerythritol monohydroxypentaacrylate, pentaerythritol triacrylate, hydantoin hexaacrylate, and the like. Also useful are ethoxylated and propoxylated derivatives of di- and polyfuncational acrylate compounds mentioned above. The preferred difunctional acrylic compound is 2,2-dimethylpropane-1,3-diacrylate. Preferred acrylic monomers with a functionality greater than two are those of the formula:

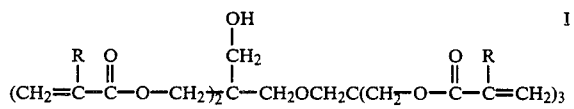

where each R can be the same or different and is independently hydrogen or a methyl group. The polymerizable acrylic compound may consist of a mixture of difunctional and polyfunctional acrylic monomers and is present preferably in an amount of from 70 to about 92%, most preferably 85 to 92%, by weight of the total coating composition.

The second essential ingredient of the radiation-curable composition of the present invention is a free-radical photoinitiator for initiating the polymerization of the acrylic compound. Useful photoinitiators for this purpose are the haloalkylated aromatic ketones, chloromethylbenzophenes, certain benzoin ethers, certain acetophenone derivatives such as diethoxyacetophenone and 2-hydroxy-2-methyl-1-phenylpropan-1-one, and preferably benzil ketals, such as $\alpha,\alpha$-dimethoxy-$\alpha$-phenyl acetophenone. These compounds have been found to be advantageous in the mixed system of the present invention in that they are effective in producing rapid cures of the liquid coating compositions, they are compatible with the other ingredients, and they yield coating solutions with excellent shelf-lives. Compounds belonging to the class of thioxanthones also provide photoinitiating activity. The free-radical photoinitiator is present in an amount of from 2 to 10%, preferably 4 to 9%, by weight of the total composition.

A preferred class of free-radical photoinitiators is the benzil ketals which are compounds having the formula

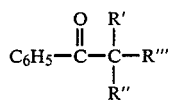   II wherein
$R'=R''=$any alkoxy radical, and
$R'''=$phenyl.

Benzil ketals exhibit excellent solubility in the coating composition, and produce rapid cures. A preferred photoinitiator is $\alpha,\alpha$-dimethoxy-$\alpha$-phenyl acetophenone (Iragacure 651 TM, Ciba-Geigy, disclosed in U.S. Pat. Nos. 3,715,293 and 3,801,329). The most preferred photoinitiator, in accordance with this invention, is 1-hydroxycyclohexylphenyl ketone (Iragacure 184 TM, Ciba-Geigy, Ardsley, NY) and is disclosed in U.S. Pat. Nos. 4,284,485 and 4,318,791. This compound, too, has excellent solubility in the coating composition, results in good shelf-life of the coating liquid, effects rapid cures, and causes little or no yellowing in polymerized films.

Other compounds that have been found effective in the practice of this invention include isobutyl benzoin ether having formula II above wherein $R'=H$, $R''=$an isobutyl group and $R'''=$phenyl; diethoxyacetophenone having formula II wherein $R'=R''=$an ethoxy radical and $R'''=H$; 2-hydroxy-2-methyl-1-phenylpropan-1-one; a halogen substituted alkylarylketone sold under the name of Sandoray TM 1000 (Sandoz Corp., Switzerland); and 3,4-bishalomethylbenzophenone (Eastman Kodak, Rochester, NY).

The third essential ingredient of the radiation-curable composition is a polymerizable epoxy-silane compound. Epoxy-silanes promote greater adhesion of the cured coating to a polyester base and to silver halide/gelatin emulsions; in addition, cured coatings containing a polymerized epoxy-silane exhibit improved resistance to abrasion. The epoxy-silanes which are useful in the radiation-curable compositions of this invention are compounds having terminal polymerizable epoxy (oxirane) groups and terminal silane groups, and can be represented by the formula:

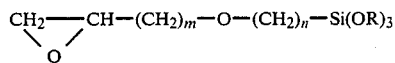   III where m and n are integers from 1 to 4, and R is an alkyl radical of 1 to 3 carbon atoms. Examples of representative epoxy-silanes include:
gamma-glycidoxypropyl trimethoxysilane,
gamma-glycidoxypropyl triethoxysilane,
beta-glycidoxyethyl trimethoxysilane,
gamma-(3,4-epoxycyclohexyl)propyl trimethoxysilane,
beta-(3,4-epoxycyclohexyl)ethyl trimethoxysilane,
and the like. The most preferred epoxy-silane compound is gamma-glycidoxypropyl trimethoxysilane. The polymerizable epoxy-functional silane constitutes from 0.1 to 20%, preferably 0.1 to 10%, by weight of the total composition.

The fourth component in the radiation-curable composition can be a cationic photoinitiator for initiating the polymerization of the epoxy-silane compound. This component may not be necessary depending on the concentration of the epoxy-silane compound. Best results are obtained if a cationic photoinitiator is used with epoxy-silane levels greater than 1% by weight of the total composition and if no cationic photoinitiator is used with epoxy-silane levels of 1% by weight or less of the total composition. When a cationic photoinitiator is used it can be present in the range of 0.0001 to 2 percent by weight of the total composition. Representative examples are the aromatic onium salts as described in U.S. Pat. Nos. 4,058,401; 4,069,055; and 4,101,513, which are incorporated herein by reference. Most preferred because of solubility, stability, and rate of cure is triphenylsulfonium hexafluoroantimonate (3M, St. Paul, MN). The photoinitiator may be present in an amount in the range of 0 to 2% of the total composition weight.

The compositions of the invention may also include contain addenda such as surface active agents, viscosity modifiers, spreading aids, dyestuffs, matting agents, coating aids, fragrances, etc. These may be blended with the components of the formulation to adjust the physical properties of the final coating. The friction reducing agents of U.S. Pat. No. 4,333,998 have also been found to be particularly useful. These materials and agents generally may constitute up to 5% by weight of the cured film, but usually total less than 1% by weight relative to the total weight of the other ingredients.

Coating with the radiation-curable composition can be carried out preferably in the absence of solvent. Typically, the coating deposited on at least one surface of the element will be a very thin layer, preferably providing a wet coverage in the range from about 2 to about 20 cubic centimeters of coating composition per square meter of surface coated, more usually in the range from about 2 to about 10 cubic centimeters of coating composition per square meter, and preferably about 5 cubic centimeters of coating composition per square meter.

For the purpose of coating phototools, the liquid compositions of this invention are designed to be of low viscosity. Depending on the particular compounds used, the viscosity may vary from 1 to 500 centipoise at 20° C.; preferably, the viscosity range is between 5 and 100 centipoise, and most preferred is a viscosity range between 10 and 50 centipoise. Because polymerization of acrylic compounds can be inhibited by oxygen in the air, it is important that the coating composition be photopolymerized as soon as possible after application to the phototool surface. When spread out as a thin film on a phototool, the coating liquid exposes a large surface area (per unit volume) in intimate contact with air, and it is in such a situation that oxygen inhibition is most effective. It has been found that best results are obtained if photopolymerization takes place within 60 seconds after application, and preferably within 30 seconds of application. Most preferred is to have cure take place within 15 seconds of application. Coating and curing take place at controlled temperature and humidity conditions, preferably 20°-23° C. and 45 to 65% relative humidity to insure dimensional stability of the phototool (preferably, within 0.004 percent). Thickness of the coated composition may range from 0.5 micrometers to 40 micrometers, but for best flexibility, transparency, and protection against abrasion, a thickness range of from 2 to 15 micrometers is preferred; most preferred is a film thickness of 2 to 10 micrometers.

Coating the radiation-curable composition may be carried out in any convenient manner so long as the criteria for film thickness and the time for cure after application are met. For example, coating may be carried out by dipping, air-knife coating, curtain coating, brush coating, roller coating, by use of wire-wound rods, bead coating, spray coating, extrusion coating and so forth. No solvents or diluents are employed which need to be removed from the coating during the curing step, and all the liquid applied during the coating operation remains as a solid polymeric film after polymerization. The composition is designed to be solvent-free for convenience and safety. It is not intended that this be a limiting feature, but merely an advantageous one. If addition of a solvent (e.g., a ketone or ester) improves applicability it may be used and is included within the practice of the present invention.

In one embodiment of the invention, a protective overcoat is applied to only the image-bearing surface of a phototool. In a second embodiment, the protective overcoat is applied only to the support side of the phototool. In a preferred embodiment of the present invention, the protective overcoat is applied to both sides of a phototool.

Any suitable radiation curing process can be used to polymerize the coating compositions of this invention. For example, polymerization can be effected by actinic radiation such as ultraviolet radiation from xenon pulsed lamps, or from mercury vapor lamps; similarly, ionizing radiation such as X-rays, gamma rays and beta rays may be used. Also, accelerated electron beams (EB radiation) are useful in effecting cure of the coating. Polymerizations can be carried out in air, or in an inert atmosphere such as nitrogen or argon. Heating is not required for rapid cures, or for satisfactory adhesion and actually is contraindicated. heat-free polymerization conditions are preferred.

The radiation-curable compositions described herein are designed to provide protective overcoats specifically for diazo and silver halide phototools. Since other uses are envisioned, such as coating of maps, graphic arts screens, X-ray films, X-ray screens, and furniture coverings, the intended purpose of phototool protection should not limit the scope of the invention.

Objects and advantages of this invention are further illustrated by the following examples, but the particular materials and amounts thereof recited in these examples, as well as other conditions and details, should not be construed to unduly limit this invention. All numbers in the formulations refer to weights in grams, unless percent is indicated, in which cases weight percent is meant.

EXAMPLE 1-9 (Comparative)

To demonstrate the wide variety of acrylate compounds suitable for compositions of this invention, solutions 1 through 9 were prepared according to the following formulations; each coating solution was bar coated onto processed silver halide and diazo phototools, and successfully cured by exposure to ultraviolet radiation.

| INGREDIENT | SOLUTION NUMBER | | | | | | | | |
| --- | --- | --- | --- | --- | --- | --- | --- | --- | --- |
| | 1 | 2 | 3 | 4 | 5 | 6 | 7 | 8 | 9 |
| A. 1,6-hexanediol diacrylate* | 5.2 | 4.0 | — | 50.0 | 49.6 | 45.0 | 36.7 | — | 4.0 |
| B. 2,2-dimethylpropany-1,3-diacrylate* | — | — | — | — | 10.0 | 5.0 | 8.1 | 59.0 | — |
| C. ethylene glycol dimethacrylate* | — | — | 25.0 | — | — | — | — | — | — |
| D. trishydroxyethyl isocyanurate triacrylate* | — | 4.7 | — | — | — | — | — | — | 4.9 |
| E. trimethylolpropane triacrylate* | — | — | — | — | — | — | — | — | 4.7 |
| F. pentaerythritol tetraacrylate* | — | — | 2.0 | — | 20.0 | 10.0 | — | — | 2.0 |
| G. dipentaerythritol hydroxypentaacrylate* | 6.7 | — | — | 27.0 | — | — | — | — | — |
| H. hexaacrylate resin (Photomer 5007 TM, Diamond-Shamrock, Morristown, NJ) | — | — | — | — | — | — | 32.8 | 33.0 | — |
| I. hydantoin hexaacrylate (3M, St. Paul, MN) | 7.6 | 5.3 | — | — | — | 21.0 | — | — | 4.0 |
| J. polydimethylsiloxanediol (Q4-337 TM, Dow Corning, Midland, MI) | 0.1 | 0.1 | — | 0.2 | 0.2 | 0.2 | 0.2 | 0.2 | — |
| K. 1-hydroxycyclohexylphenyl ketone | 1.0 | 0.6 | 0.9 | 7.5 | 7.5 | 7.1 | 7.3 | 7.4 | 0.7 |
| L. fluorochemical surfactant (FC-430 TM, 3M) | 0.2 | — | 0.1 | 0.2 | 0.3 | 0.3 | 0.3 | 0.2 | — |
| M. gamma-glycidoxypropyl trimethoxysilane (Dow Corning) | 1.8 | — | 41.5 | 10.5 | 10.5 | 10.0 | 13.0 | 0.1 | 0.1 |
| N. triphenylsulfonium hexafluoroantimonate (3M) | 0.4 | — | 2.1 | 1.5 | 1.5 | 1.5 | 1.6 | — | — |

*(available from Sartomer Company, West Chester, PA)

EXAMPLE 10 (Comparative)

A radiation-curable coating composition was prepared as follows:

| | |
| --- | --- |
| A. gamma-glycidoxypropyl trimethoxysilane (Z-6040 TM epoxy-silane, Dow Corning) | 96.00% |
| B. triphenylsulfonium hexafluoroantimonate (solventless) (Uvox TM catalyst, 3M Company) | 3.85% |
| C. fluorochemical surfactant (FC-430, 3M Company) | 0.15% |
| | 100.00% |

The above solution was coated onto the image-bearing surface of a processed diazopositive film with a #3 wire-wound coating bar, and exposed for 10 seconds to a 118 watt/cm (300 watt/inch) medium pressure mercury vapor lamp at a distance of 22.9 cm (9 inches). Little or no curing occurred. Instead, the coating liquid was observed to have attacked the diazo emulsion and to have dissolved some of the image. Additional ultraviolet exposure did not effect cure. This example demonstrates the great solvency effect that the above epoxysilane compound has on diazo emulsions.

EXAMPLE 11 (Comparative)

A UV curable coating composition was prepared as follows:

| | | |
|---|---|---|
| A. | 2,2-dimethylpropane-1,3-diacrylate (SR-247 TM, Sartomer Corporation) | 60.0% |
| B. | hexafunctional acrylate monomer (Photomer 5007 TM, Diamond Shamrock Corporation) | 32.4% |
| C. | fluorochemical surfactant (FC-430, 3M Company) | 0.2% |
| D. | 1-hydroxycyclohexyl phenyl ketone (Irgacure 184 TM, Ciba-Geigy Corp.) | 7.4% |
| | | 100.0% |

The above solution was coated onto a sheet of processed X-ray film (silver halide emulsion) with a #5 wire-wound coating bar, and exposed to ultraviolet radiation as in Example 10. Good cure resulted to provide a glossy, flexible coating which exhibited poor adhesion when the substrate was sharply creased. The coating could be peeled away in large flakes indicating unsatisfactory adhesion to a silver halide emulsion. When coated on a diazo phototool, the above composition cured and performed well, and exhibited excellent adhesion. This example demonstrates that, while acrylates may adhere well to diazo emulsions, poor adhesion can occur on silver halide emulsion surfaces.

EXAMPLES 12–21

UV curable coating solutions were prepared using the following formula:

| | | |
|---|---|---|
| A. | gamma-glycidoxypropyl trimethoxysilane | 13.0% |
| B. | triphenylsulfonium hexafluoroantimonate | 1.6% |
| C. | hexaacrylate resin (Photomer 5007) | 33.0% |
| D. | 2,2-dimethylpropane-1,3-diacrylate | 8.3% |
| E. | 1,6-hexanediol diacrylate | 36.5% |
| F. | fluorochemical surfactant (FC-430) | 0.4% |
| G. | polydimethylsiloxanediol (Q4-3667) | 0.2% |
| H. | free-radical photoinitiator (TABLE I, below) | 7.0% |
| | | 100.0% |

Different free-radical photoinitiators were then added at a 7.0% level to evaluate effectiveness and solution stability. The names and structures of the photoinitiators tested are presented below, numbered 12 through 21. After preparation, the coating solutions were stored in glass bottles at room temperature in the dark. Each solution was trial coated at 30 day intervals up to the end of the test (330 days). The coating trial consisted of bar coating the solution onto a diazo phototool and curing (in air) under ultraviolet light as described in Example 10. Quickness of cure and hardness of the polymerized film were used to judge effectiveness of the photoinitiator, and to determine if changes occurred with solution age.

TABLE I

| Example No. | Name and structure of free-radical photoinitiator |
|---|---|
| 12 | 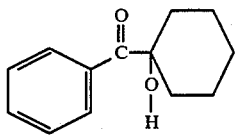 1-hydroxycyclohexyl phenyl ketone |
| 13 | 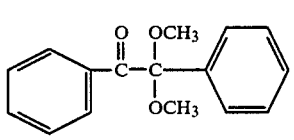 2,2-dimethoxy-2-phenyl acetophenone |
| 14 | 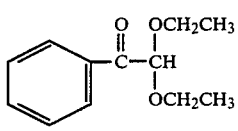 diethoxyacetophenone |
| 15 | 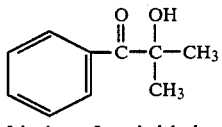 2-hydroxy-2-methyl-1-phenylpropan-1-one |
| 16 | 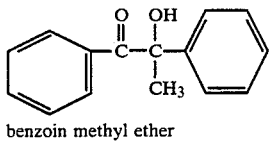 benzoin methyl ether |
| 17 | 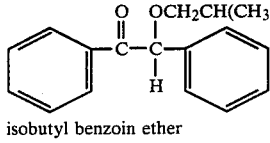 isobutyl benzoin ether |
| 18 | Sandoray TM 1000 (a halogenated aromatic ketone) |
| 19 | 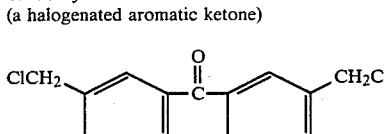 3,4-bischloromethylbenzophenone |
| 20 | 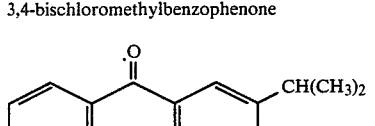 2-isopropyl thioxanthone |
| 21 | 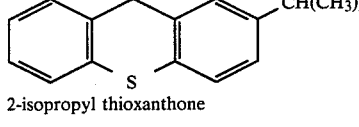 chlorothioxanthone |

Example 13 is a benzil ketal; Examples 12, 14 and 15 may be considered as derivatives of acetophenone; Examples 16 and 17 represent benzoin ethers; Examples 18 and 19 are chlorobenzophenone derivatives; and Examples 20 and 21 represent thioxanthone derivatives. All photoinitiators listed, with the exception of numbers 16, 20, and 21, were completely compatible with the "mixed" system and produced fully cured films on diazo phototools for the entire length of the test (330 days). Although isobutyl benzoin ether (Example 17) was a suitable photoinitiator, benzoin methyl ether (Example 16) was not; Example 16 provided an unstable solution, forming two phases after just 15 days of storage. In Examples 20 and 21 the thioxanthone derivatives proved insoluble in the coating composition and were ineffective at their saturated solubilities.

EXAMPLES 22 AND 23

Abrasion resistance of cured films of the coating composition, with and without the epoxy-silane component, were measured by a falling sand method according to ASTM D968-81, using 200 ml of standard sharp sand. Compositions 22 and 23 were prepared as follows:

| INGREDIENTS | Ex. 22 (g) | Ex. 23 (g) |
| --- | --- | --- |
| hexaacrylate resin (Photomer 5007) | 32.8 | 32.8 |
| 2,2-dimethylpropane-1,3-diacrylate | 8.1 | 8.1 |
| 1,6-hexanediol diacrylate | 36.7 | 36.7 |
| surfactant (FC-430) | 0.4 | 0.4 |
| polydimethylsiloxanediol (Q4-3667) | 0.2 | 0.2 |
| 1-hydroxycyclohexyl phenyl ketone | 7.3 | 7.3 |
| gamma-glycidoxylpropyl trimethoxysilane | 12.6 | — |
| triphenylsulfonium hexafluoroantimonate | 1.6 | — |

Each solution was coated on clear polyester film using a #10 wire-wound bar, and cured under ultraviolet light. After aging for 5 hours, the coated samples were rotated at a 45 degree angle while being bombarded by 200 ml. of standard sharp sand, falling from a height of 0.9 meters (3 feet). The haze produced by the abrading sand was then measured in a Gardner TM Automatic Photometric Colorgard Unit (Gardner Laboratory, Inc., Bethasda, MD).

| | Average % haze |
| --- | --- |
| Example 22 | 22% |
| Example 23 (comparative) | 48% |

In this test, the greater the abrasion resistance, the less haze produced. The data indicates that the epoxy-silane component significantly increased the abrasion resistance of the cured coating.

EXAMPLE 24

A radiation-curable composition was prepared according to the following formulation:

| | (g) |
| --- | --- |
| A. gamma-glycidoxypropyl trimethoxysilane | 82.5 |
| B. triphenylsulfonium hexafluoroantimonate | 9.0 |
| C. 2,2-dimethylpropane-1,3-diacrylate | 510.0 |
| D. hexaacrylate resin (Photomer 5007) | 321.0 |
| E. surfactant (FC-430) | 1.5 |
| F. polydimethylsiloxanediol (Q4-3667) | 1.8 |
| G. 1-hydroxycyclohexyl phenyl ketone | 72.0 |

When the above coating composition was coated onto a diazo phototool, and photopolymerized within 30 seconds of its initial contact with the phototool, a flexible, abrasion resistant, transparent cured coating was obtained with excellent solvent repellency and adhesion. However, when the wet coating was allowed to stand in contact with the diazo phototool for a minute or more, and then irradiated, only partial curing took place, and the protection afforded by the coating was inferior. This demonstrates the desirability of curing the coating composition rapidly after applying to the phototool (preferably less than 1 minute from the time of initial contact of the coating liquid with the phototool surface before cure).

EXAMPLE 25

A radiation-curable composition was prepared according to the following formula:

| A. gamma-gylcidoxypropyl trimethoxysilane | 1.05 g |
| --- | --- |
| B. 2,2-dimethylpropane-1,3-diacrylate | 333.00 g |
| C. dipentaerythritol hydroxypentaacrylate | 125.00 g |
| D. surfactant (FC-430) | 0.45 g |
| E. polydimethylsiloxanediol (Q4-3667) | 0.90 g |
| F. 1-hydroxycyclohexyl phenyl ketone | 37.50 g |

When coated onto diazo or silver halide type phototools and photopolymerized within 30 seconds of initial contact, the above composition produced cured coatings having excellent abrasion resistance, solvent repellency, and adhesion to the substrate.

Various modifications and alterations of this invention will become apparent to those skilled in the art without departing from the scope and spirit of this invention, and it should be understood that this invention is not to be unduly limited to the embodiments set forth herein.

I claim:

1. A radiation-curable composition comprising:
   (a) 70 to 92 weight percent of the total composition of at least one polymerizable non-silane-containing acrylic compound,
   (b) 0.1 to 20 weight percent of the total composition of at least one polymerizable epoxy-functional silane compound,
   (c) 2 to 10 weight percent of the total composition of a benzil ketal free-radical photoinitiator capable of initiating polymerization of said acrylic compound, and
   (d) 0 to 2 weight percent of the total composition of a cationic photoinitiator capable of initiating polymerization of said epoxy-functional silane compound, said composition being solvent-free or containing only ester or ketone solvent and said composition containing epoxy functionality only in a silane compound.

2. A radiation-curable composition comprising:
   (a) at least one polymerizable non-silane-containing acrylic compound,
   (b) at least one polymerizable epoxy-functional silane compound,
   (c) a free-radical photoinitiator capable of initiating polymerization of said acrylic compound, and
   (d) optionally, a cationic photoinitiator capable of initiating polymerization of said epoxy-functional silane compound, said composition being solvent-free or containing only ester or ketone solvent and said composition containing epoxy functionality only in a silane compound.

3. A radiation-curable composition comprising:

(a) 70 to 92 weight percent of the total composition of at least one polymerizable non-silane-containing acrylic compound, (b) 0.1 to 20 weight percent of the total composition of at least one polymerizable epoxy-functional silane compound, (c) 2 to 10 weight percent of the total composition of a free-radical photoinitiator capable of initiating polymerization of said acrylic compound, and (d) 0 to 2 weight percent of the total composition of a cationic photoinitiator capable of initiating polymerization of said epoxy-functional silane compound, said composition being solvent-free or containing only ester or ketone solvent and said composition containing epoxy functionality only in a silane compound.

4. The composition according to claim 2 wherein said at least one acrylic compound consists of a mixture of two or more acrylic compounds having acrylic functionality of two or more.

5. The composition according to claim 4 wherein one of said acrylic compounds of said mixture has the formula

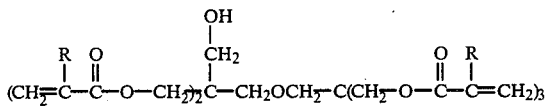

wherein R is independently hydrogen or methyl.

6. The composition according to claim 4 wherein said acrylate compound is a mixture of 2,2-dimethylpropane-1,3-diacrylate and dipentaerythritol monohydroxypentaacrylate.

7. The composition according to claim 2 wherein said epoxy-functional silane compound has terminal epoxy and silane groups.

8. The composition according to claim 7 wherein said epoxy-functional silane compound has the formula

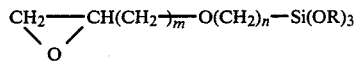

wherein
R is an alkyl radical of 1 to 3 carbon atoms, and
m and n are independently integers of 1 to 4.

9. The composition according to claim 8 wherein said epoxy-functional silane compound is gamma-glycidoxypropyltrimethoxysilane.

10. The composition according to claim 2 wherein said free-radical photoinitiator is a benzil ketal compound or an acetophenone derivative.

11. The composition according to claim 2 wherein said cationic photoinitiator is an aromatic onium compound.

12. The composition according to claim 2 wherein said cationic photoinitiator is present in the amount of 0.0001 to 2 percent by weight of the total composition.

13. The composition according to claim 2 which has been cured by actinic radiation.

* * * * *